(12) United States Patent
Moser

(10) Patent No.: US 7,875,797 B2
(45) Date of Patent: Jan. 25, 2011

(54) HOUSING WITH DISPLAY—AND/OR OPERATING-ELEMENT

(75) Inventor: Thierry Moser, Sierentz (FR)

(73) Assignee: Endress + Hauser Flowtec AG, Reinach (CH)

( * ) Notice: Subject to any disclaimer, the term of this patent is extended or adjusted under 35 U.S.C. 154(b) by 735 days.

(21) Appl. No.: 11/666,170

(22) PCT Filed: Oct. 24, 2005

(86) PCT No.: PCT/EP2005/055491
§ 371 (c)(1),
(2), (4) Date: Nov. 20, 2007

(87) PCT Pub. No.: WO2006/045770
PCT Pub. Date: May 4, 2006

(65) Prior Publication Data
US 2008/0123259 A1 May 29, 2008

(51) Int. Cl.
*H05K 5/00* (2006.01)
(52) U.S. Cl. .................... 174/50; 174/520; 174/521; 174/535; 361/679.01
(58) Field of Classification Search ............ 174/50, 174/520, 521, 535, 559, 650, 50.5, 50.52; 361/679.01, 679.02
See application file for complete search history.

(56) References Cited

U.S. PATENT DOCUMENTS

| | | | |
|---|---|---|---|
| 6,539,819 B1 | 4/2003 | Dreyer | |
| 6,600,103 B1 * | 7/2003 | Schmidt et al. | 174/559 |
| 6,740,814 B2 * | 5/2004 | Ohta et al. | 174/50 |
| 7,102,078 B2 * | 9/2006 | Weber et al. | 174/50 |
| 7,151,674 B2 * | 12/2006 | Sasaki et al. | 174/521 |
| 7,291,784 B2 * | 11/2007 | Moore et al. | 174/50 |
| 7,614,148 B2 * | 11/2009 | Chamberlain | 174/50 |
| 7,616,448 B2 * | 11/2009 | Degenkolb et al. | 174/521 |

FOREIGN PATENT DOCUMENTS

| | | |
|---|---|---|
| DE | 34 0 6 295 A1 | 8/1984 |
| DE | 43 41 239 A1 | 6/1994 |
| DE | 196 46 583 A1 | 6/1997 |
| DE | 197 55 924 A1 | 7/1999 |

* cited by examiner

*Primary Examiner*—Angel R Estrada
(74) *Attorney, Agent, or Firm*—Bacon & Thomas, PLLC

(57) ABSTRACT

An economically producible pressure-resistant housing with a display element and/or operating element for use in potentially explosive areas, comprising an inner space which serves to accommodate electronics, and a recess on the outside, inside of which a display and/or operating element is placed whose connecting lines extend into the inner space via a pressure-resistant leadthrough, wherein the display and/or operating element is surrounded on all sides by a pressure-resistant, crystal-clear encapsulation, which fills remaining cavities in the recess and outwardly closes the recess.

6 Claims, 3 Drawing Sheets

HOUSING WITH DISPLAY—AND/OR OPERATING-ELEMENT

TECHNICAL FIELD

The invention relates to a housing with a display- and/or operating-element for use in explosion-endangered areas.

BACKGROUND DISCUSSION

In industrial measurements technology, electronic devices, especially measuring devices, are regularly used in locations where a danger of explosion exists. Examples include flour silos, gas, i.e. fueling, stations, and chemical plants, where explosive gases can exist.

Commonly used measuring devices include e.g. flow, fill-level and pressure measuring devices.

Special safety requirements are placed on devices usable in explosion-endangered areas. These requirements have the goal of avoiding spark formation, which could, in the right circumstances, lead to an explosion, or of preventing that a spark occurring in a sealed chamber has any effects on the environment of the chamber. Such a goal is achievable in different ways, which are referred to in corresponding European standards as ignition protection types.

Thus e.g. according to European Standard EN 50 020 of the year 1994, explosion protection is given, when devices are built according to the protection class defined therein named 'Intrinsic Safety' (Ex-i). According to this protection class, the values for the electrical variables, current, voltage and power, in a device have to lie at all times each below a predetermined limit value. The three limit values are so selected that, in the case of malfunction, e.g. due to a short circuit, the maximum occurring release of energy is not sufficient to produce an ignition spark. The variables are maintained below their respective predetermined limit values as follows: Electrical current e.g. by resistors, voltage e.g. by Zener diodes, and power by appropriate combinations of current and voltage limiting elements.

Another protection class is described in the European Standard EN 50 018 of the year 1994 under the title 'Pressure-Resistant Encapsulation' (Ex-d). Devices built according to this protection class have a pressure-resistant housing, by which is assured that an explosion occurring in the interior of the housing can not be transmitted outside. Pressure-resistant housings are, in order that they have a sufficient mechanical strength, thick walled and, thus, heavy and expensive.

USA, Canada, Japan and other countries have standards comparable with these European standards.

The requirements of explosion protection hold true, naturally, not only for the actual measuring device, but also for display- and/or operating-elements used in explosion-endangered areas. Display elements serve e.g. for displaying measured values on-site. Operating elements are used e.g. for adjusting device settings or inputting operating parameters on-site.

Display- and/or operating-elements are, for reasons of explosion protection, today frequently located in inner spaces of the housing of the measuring device or in separate housing parts, which are sealed e.g. by means of a pressure-resistant lid. Such lids include, as a rule, a viewing window, for enabling the display to be observed. It is possible to equip the operating element with optical buttons, or keys, which can be operated through the viewing window. More economical, mechanical buttons cannot be operated through the lid. The lid represents an additional component, with which increased production costs are associated.

SUMMARY OF THE INVENTION

It is an object of the invention to provide a housing having a display- and/or operating-element. The housing is to be usable in explosion-endangered areas and economical to manufacture.

To this end, the invention resides in a housing having
an inner space for accommodating an electronics, and
an external recess,
in which a display- and/or operating-element is located, connection lines of which extend via a pressure-resistant feedthrough into the inner space,
wherein the display- and/or operating-element is surrounded on all sides by a pressure-resistant, transparent pottant,
which fills vacant spaces left in the recess and environmentally seals the recess.

In a further development, the feedthrough comprises a metal insert, which has a first section screwed into a threaded bore connecting the inner space with the recess.

In a further development of the last-mentioned further development, the insert has, adjoining the first section, a second section, which lines the recess and which has, open in a direction facing away from the first section, an inner space, in which the display- and/or operating-element is located.

In a further development, the first section has, at an end facing the inner space of the housing, and open to the inner space of the housing, a cavity, in which a pressure-resistant sealant, especially a casting resin, is provided, which surrounds the connection lines.

In a further development, the display- and/or operating-element includes optical keys, which are operable through the pottant.

In another further development, the display- and/or operating-element includes mechanical keys, which are operable through passageways in the pottant sealed by means of a key cover, and is fed via current- and voltage-limiting elements located in the housing.

In another further development, the display- and/or operating-element is connected with the insert and the insert is rotatable into a desired position and securable by means of a securement.

In another further development, a retaining ring is situated in an outer groove of the first section.

BRIEF DESCRIPTION OF THE DRAWINGS

The invention and further advantages will now be explained in greater detail on the basis of the figures of the drawing, in which two examples of embodiments are presented; equal parts are provided with equal reference characters in the figures. The figures show as follows.

DETAILED DESCRIPTION

Figure 1:
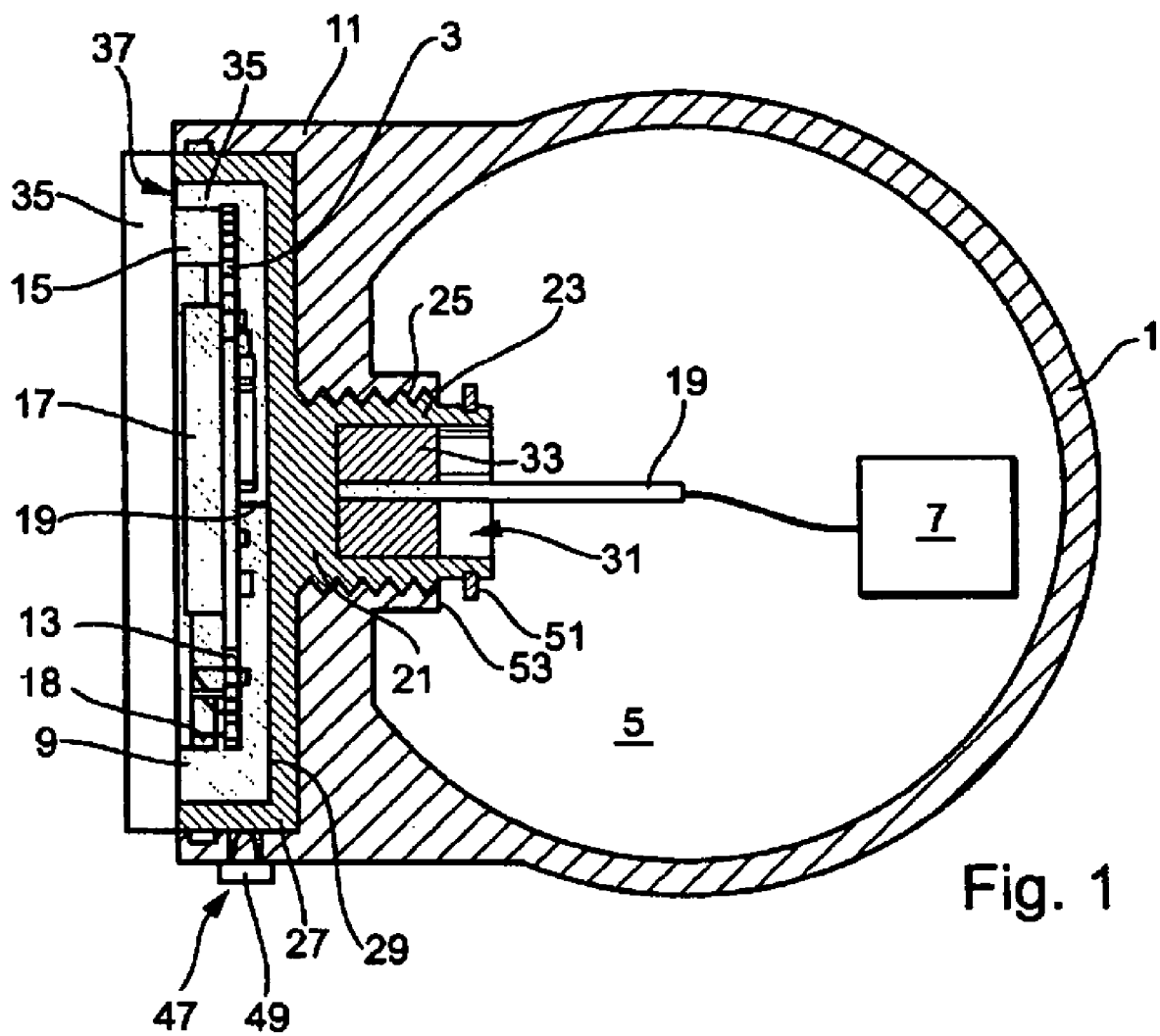
FIG. 1a section through a housing constructed according to the protection class Ex-d, including a display- and/or operating-element with optical keys.

FIG. 1 shows a section through a first example of an embodiment of a housing 1 of the invention, with a display- and/or operating-element 3. Housing 1 is, for example, a housing of a measuring device, e.g. a flow-, pressure- or fill-level-measuring device. The housing includes an inner space 5 for accommodating an electronics 7, e.g. a measuring device electronics, shown only schematically in FIG. 1.

Housing 1 is made of metal, e.g. aluminum, and is constructed to be pressure-resistant. In this way, it is assured that an explosion occurring in the interior of the housing cannot be transmitted to the exterior. Because of this, housing 1 can be used in explosion-endangered areas.

Housing 1 includes an external recess 9, in which the display- and/or operating-element 3 is located. In the illustrated example of an embodiment, recess 9 is formed by a hollow, cylindrical element 11 formed on housing 1 and open outwards.

The display- and/or operating-element 2 includes a circuit board 13, on which both keys 15 as well as also a display are situated in the illustrated example of an embodiment. Keys 15 and display 17 are mounted directly on the circuit board 13 and are surrounded by a plastic holder 18 likewise secured on the circuit board 13. In such case, both conventional circuit boards as well as also three dimensional, injected circuits, so-called 3-D MID's (3-Dimensional Molded Interconnection Devices) can be used. The display- and/or operating-element 3 includes connecting lines 19, which extend via a pressure-resistant feedthrough into the inner space 5 of the housing 1.

The pressure-resistant feedthrough comprises a metal insert 21, e.g. of steel. Insert 21 has a first section 23, which is screwed into a threaded bore 25 connecting the inner space 5 with the recess 9. By this screwed engagement, insert 21 is connected externally pressure-resistantly with the housing 1.

Adjoining first section 23 is a second section 27, which lines the recess 9. Second section 27 has, open in a direction facing away from the first section 23, an inner space, in which the display- and/or operating-element 3 is located. In the illustrated example of an embodiment, the second section 27 has the form of a hollow cylinder closed on one end by a floor 29. The outer, lateral surface of the hollow cylinder lies flushly against the corresponding inner, lateral surface of recess 9.

First section 23 is a solid cylinder, which has, on its end facing the inner space 5, and open to the inner space 5, a cavity 31, through which the connection lines 19 extend.

Connection lines 19 are assembled in the illustrated example of an embodiment into a flat tape cable. A pressure-resistant sealant 33, especially a castable resin, such as e.g. polyurethane, is charged into the cavity 31 and surrounds the connection lines 19. Preferably, a material with a Shore hardness of 70 to 80 is used. The pressure-resistance of sealant 33 assures the pressure-resistance of the feedthrough.

Display- and/or operating-element 3 is surrounded on all sides by a pressure-resistant, crystal-clear, or transparent, pottant 35. Suitable for this purpose is e.g. an epoxy resin or a polyurethane. Also here preferably a material with a Shoren hardness of 70 to 80 is used. The pottant 35 fills the vacant space remaining in the recess 9 and seals the recess 9 to the exterior, i.e. externally.

For reasons of electromagnetic compatibility, display- and/or operating-element 3 is preferably shielded with an electrically conductive layer 37 electrically connected with the insert 21 and with the housing 1. Conductive layer 37 is e.g. a conductive film or a sheet-metal stamping, and has openings to expose the keys 15 and the display 17.

In the illustrated example of an embodiment, conductive layer 37 extends across the front of recess 9 and is electrically connected with an, in this case, annular end surface of the insert 21. Through the direct contact between the insert 21 and the housing 1, there is, at the same time, an electrically conductive connection to the housing 1. Outside of the conductive layer 37, there is an, in this case, circular, disk-shaped layer of the pottant 35. Its outer diameter is equal to the outer diameter of the insert 21. This offers the advantage that the display- and/or operating-element 3 can be pre-mounted in the insert 21 and surrounded with pottant 35, and the thus-formed unit can then be installed into the housing 1.

In manufacture, insert 21 is populated with the display- and operating-element 3 and the connection lines 19 thereof fed through. Then, the conductive layer 37 is mounted, and the unit formed in this way is placed in an appropriate mold and pottant is cast in place. Following hardening of the pottant 35, it provides a pressure-resistant seal.

Further structural elements, such as e.g. the pressure-resistant glass lids regularly used in the prior art, built according to specifications of explosion protection, are not required for sealing housing 1 and/or the display- and/or operating-element 3. In this way, manufacturing costs are markedly reduced as compared with the prior art.

In the case of the example of an embodiment illustrated in FIG. 1, the keys 15 are optical keys, which are operable through the transparent pottant 35 located thereover.

Figure 2:
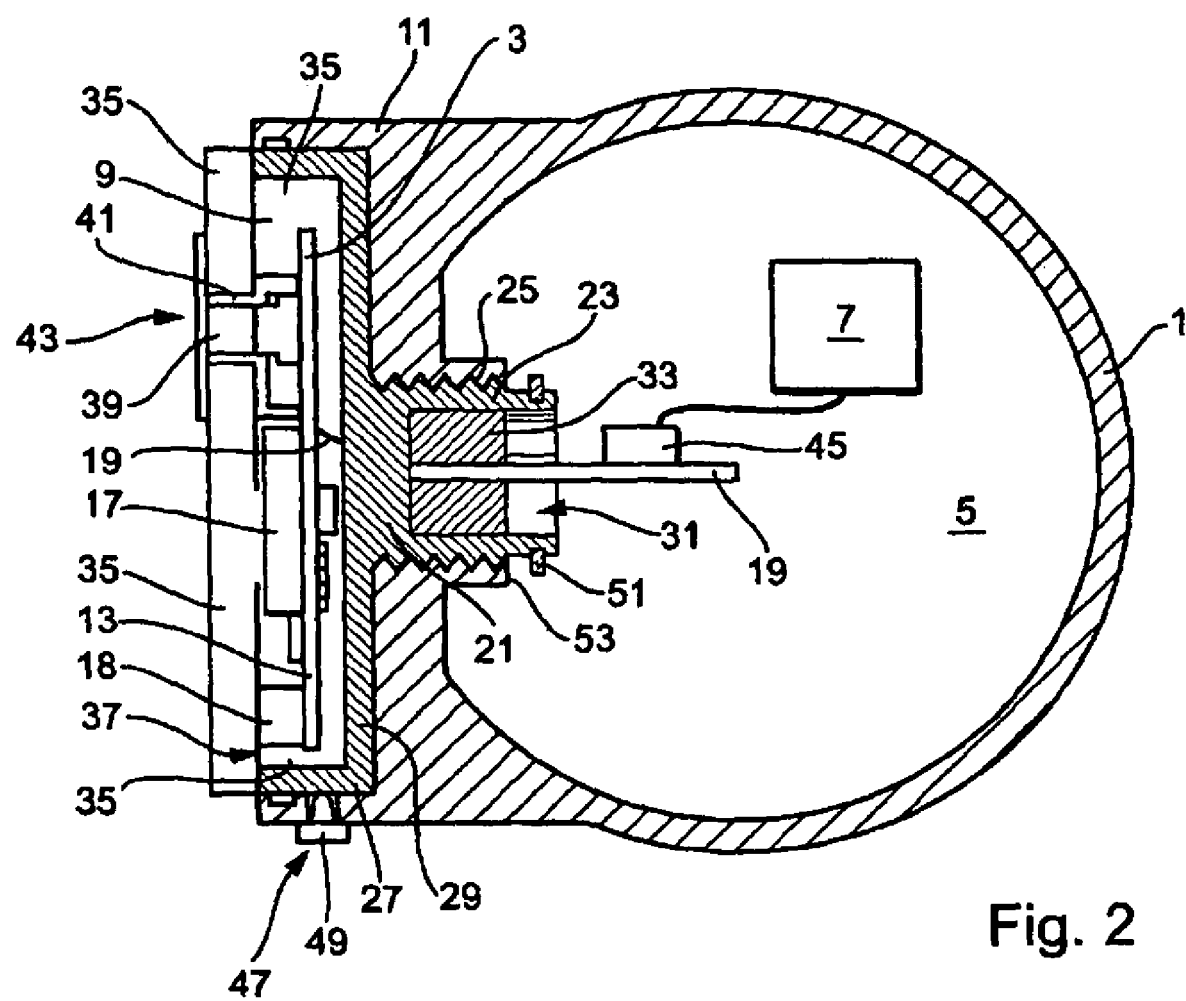
FIG. 2a section through a pressure-resistant housing including a display- and/or operating-element with mechanical keys.
Figure 3:
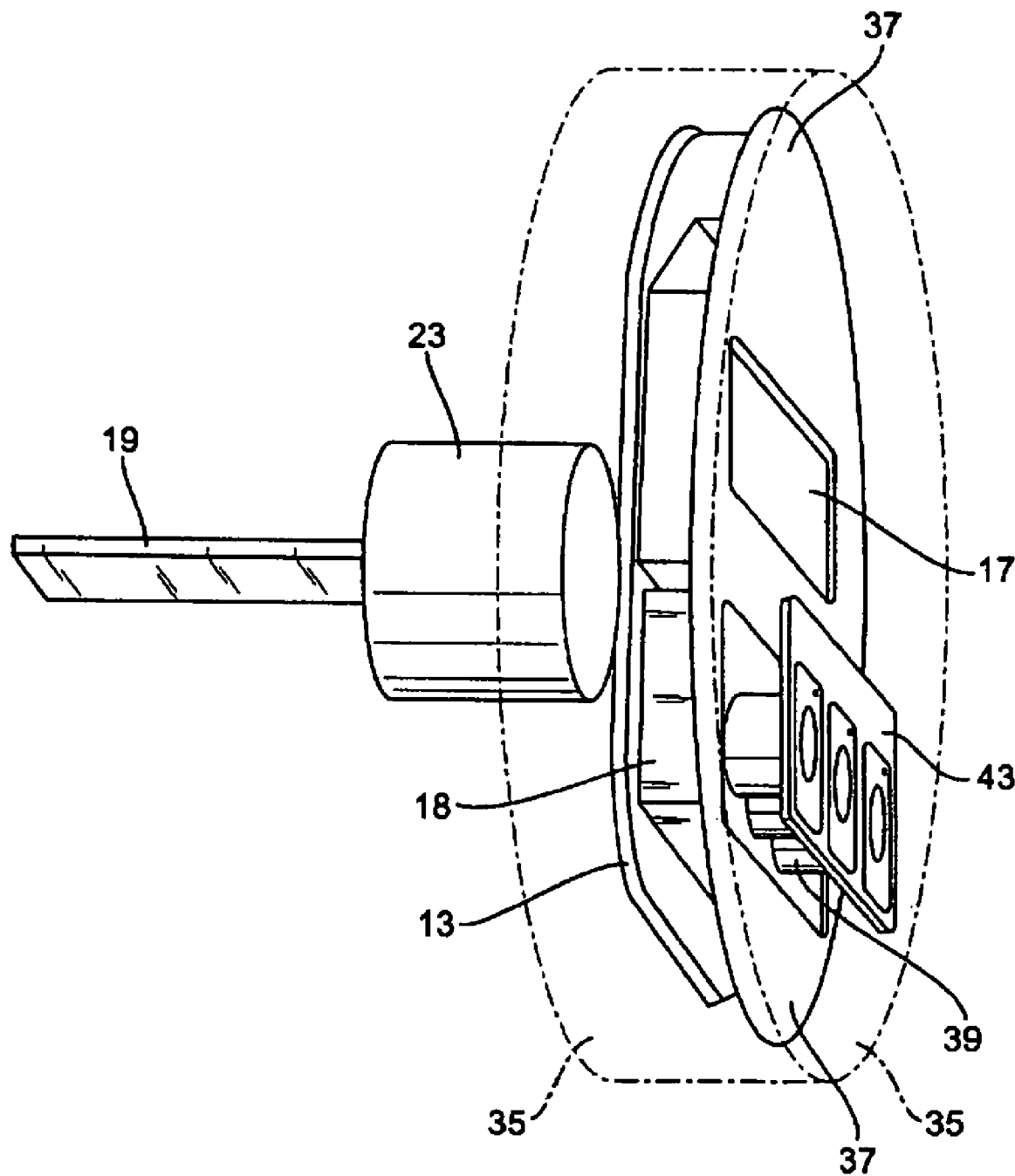
FIG. 3a view of the display- and/or operating-element shown in FIG. 2.

Alternatively, more cost-favorable, mechanical keys 39 can be used. FIG. 2 shows, by way of a section through a pressure-resistant housing 1 with a display- and/or operating-element 3 equipped with mechanical keys 39, an example of another embodiment. FIG. 3 is a view of the display- and/or operating-element illustrated in FIG. 2. Due to the great similarity of the embodiment of FIG. 2 to the embodiment of FIG. 1, in the following, only differences are explained in detail. These arise from the fact that, instead of the optical keys 15 shown in FIG. 1, here mechanical keys 39 are provided. For each mechanical key 39, there is a passageway 41 in the pottant, for exposing the associated key 39. The keys 39 terminate flushly with the pottant 35. The passageways 41 and a surrounding area of the pottant 35 are sealed with a key cover 43. The key cover 43 is e.g. a layer of elastomer glued to the pottant 35. The passageways 41 represent interruptions of the pressure-resistant encapsulation of the display- and/or operating-element 3 in this region. However, on the side of the circuit board 13 facing away from the keys 39, potting compound 35 located between the floor 29 of the insert 21 and the circuit board 13 still provides a pressure-resistant seal, exactly as in the case of the example of an embodiment illustrated in FIG. 1.

Supply of power to the display- and/or operating-element 3 occurs via elements 45 located inside the housing 1 for limiting current and voltage according to the above-described protection class Ex-i. If the inner space of housing 1 is pressure-resistantly encapsulated, then it is sufficient to connect the current and voltage limiting elements 45 between the electronics 7 and the connection lines 19 for this purpose. If the entire electronics 7 located in the interior of housing 1 is already constructed according to protection class Ex-i, then the current and voltage limiting elements 45 can be omitted.

Insert 21 is screwed into the threaded bore 25. This screwed connection offers the advantage that the insert 21 and, consequently, the display- and/or operating-element 3 connected therewith, can be rotated into a desired position. When insert 21 is in the desired position, it is preferably secured by means of a securement 47 for preventing further rotation. Suitable for this purpose are e.g. the locking pins 49 shown in FIGS. 1 and 2, which, in each case, screw in a threaded bore in the hollow, cylindrical element 11 into locking contact against the insert 21.

Preferably, additionally provided is a safety element, for assuring that insert 21 cannot be screwed too far out, in the process of adjusting to the desired position. In most applications, a thread length of about 15 mm is adequate for assuring a sufficient pressure resistance. These thread lengths, which are, as a rule, predetermined by national specifications, must not be subceeded. In the illustrated examples of embodiments, the safety element is provided in the form of a retaining ring 51, which is placed in an outer groove in the first section 21. Due to the retaining ring 51, the insert 11 can only be screwed out so far, until the retaining ring 51 comes into contact with an abutment surface 53 bordering the threaded bore 25.

LIST OF REFERENCE CHARACTERS

1 housing
3 display- and/or operating-element
5 inner space
7 electronics
9 recess
11 hollow, cylindrical element
13 circuit board
15 keys
17 display
18 plastic holder
19 connection lines
21 metal insert
23 first section
25 threaded bore
27 second section
29 floor
31 cavity
33 sealant
35 pottant
37 conductive layer
39 mechanical keys
41 passageway
43 key cover
45 current and voltage limiting element
47 securement
49 locking pin
51 retaining ring
53 abutment surface

The invention claimed is:

1. A housing having:
an inner space for accommodating electronics; and
an external recess, in which a display- and/or operating-element is located; and
connection lines of which extend via a pressure-resistant feedthrough into said inner space, wherein:
said display- and/or operating-element is surrounded on all sides by a pressure-resistant, transparent pottant, which fills vacant spaces left in said recess and environmentally seals said recess
the feedthrough comprises a metal insert, which has a first section, which is screwed into a threaded bore connecting said inner space with said recess; and
said first section has, on an end facing said inner space of the housing, and open to the inner space of the housing, a cavity, in which a pressure-resistant sealant, especially a casting resin, is provided, which surrounds said connection lines.

2. The housing as claimed in claim 1, wherein:
said insert has, adjoining said first section, a second section, which lines said recess and which has, open in a direction facing away from said first section, an inner space, in which said display- and/or operating-element is located.

3. The housing as claimed in claim 1, wherein:
said display- and/or operating-element includes optical keys, which are operable through the pottant.

4. The housing as claimed in claim 1, wherein:
said display- and/or operating-element includes mechanical keys, which are operable through passageways in the pottant sealed by means of a key cover, and is fed via current- and voltage-limiting elements located in the housing.

5. The housing as claimed in claim 1, wherein:
said display- and/or operating-element is connected with said insert and said insert is rotatable into a desired position and securable by means of a securement.

6. The housing as claimed in claim 1, further having:
a retaining ring situated in an outer groove of said first section.

* * * * *